(12) United States Patent  
Kamei et al.

(10) Patent No.: US 9,166,018 B2
(45) Date of Patent: Oct. 20, 2015

(54) METHOD OF MANUFACTURING SEMICONDUCTOR DEVICE

(71) Applicant: Fuji Electric Co., Ltd., Kanagawa (JP)

(72) Inventors: Toshihito Kamei, Saitama (JP); Seiji Noguchi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 13 days.

(21) Appl. No.: 14/274,435

(22) Filed: May 9, 2014

(65) Prior Publication Data

US 2014/0377941 A1    Dec. 25, 2014

(30) Foreign Application Priority Data

Jun. 25, 2013 (JP) ................................. 2013-133210

(51) Int. Cl.
*H01L 29/66* (2006.01)
(52) U.S. Cl.
CPC .............................. *H01L 29/66333* (2013.01)
(58) Field of Classification Search
CPC . H01L 29/0834; H01L 29/32; H01L 29/7397; H01L 23/861; H01L 23/8611; H01L 23/66333; H01L 27/0664; H01L 27/0727; H01L 29/0696; H01L 29/0619; H01L 29/0615
See application file for complete search history.

(56) References Cited

U.S. PATENT DOCUMENTS

2010/0078765 A1*    4/2010   Schulze et al. ................ 257/587

FOREIGN PATENT DOCUMENTS

| JP | 2001-244241 A | 9/2001 |
| JP | 2009-124049 A | 6/2009 |
| JP | 2010-171179 A | 8/2010 |

* cited by examiner

*Primary Examiner* — Mamadou Diallo
*Assistant Examiner* — Christina Sylvia
(74) *Attorney, Agent, or Firm* — Chen Yoshimura LLP (57) ABSTRACT

When forming a p+ area and n+ area on the same surface of an n− semiconductor wafer, a first ion implantation forms the p+ area on the entire rear surface of the n− semiconductor wafer. Next, a resist mask selectively covering the rear surface of the n− semiconductor wafer is formed. With this resist mask as the mask, an n-type impurity is injected into the rear surface of the n− semiconductor wafer through a second ion implantation to form the n+ area on a portion deeper from the rear surface of the n− semiconductor wafer than the p+ type area. Thereafter, the n− semiconductor wafer is exposed to an oxygen ($O_2$) gas atmosphere with fluorine (F) gas added to remove the resist mask and a silicon part between the rear surface of the n− semiconductor wafer in an FWD area not covered by the resist mask and the n+ area.

7 Claims, 4 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device.

2. Description of Related Art

In vertical semiconductor devices such as IGBTs (insulated-gate bipolar transistors) and FWDs (free-wheeling diodes), it is common for the respective semiconductor areas constituting surface element structures to be formed on the surface of a semiconductor wafer, and for p-type or n-type areas to be formed on the rear surface of the semiconductor wafer. In a Reverse Conducting IGBT (RC-IGBT) that has an IGBT and FWD embedded in the same semiconductor chip, for example, both the p-type and n-type areas are formed on the rear surface of the semiconductor wafer.

A well-known method (hereinafter, the first conventional method) of forming the p-type and n-type areas on the rear surface of the semiconductor wafer includes covering the formation area for one of the p-type and n-type areas with a resist mask, performing ion implantation with this resist mask as the mask in order to inject impurities into the formation area for another semiconductor area, and repeating this twice while changing the conductivity type of the portion covered by the resist mask and the impurities injected during the ion implantation.

Specifically, in the first conventional method, first the rear surface of the semiconductor wafer is coated with resist, and this resist is patterned to form a first resist mask that covers the FWD area and exposes the IGBT area. Next, boron (B) is implanted into the rear surface of the semiconductor wafer with the first resist mask as the mask in order to form a p+ area that serves as a p+ collector region in the IGBT area on the rear surface of the semiconductor wafer. Then, the first resist mask is removed by ashing. Thereafter, the rear surface of the semiconductor wafer is coated with resist again.

Next, the resist is patterned to form a second resist mask that covers the IGBT area and exposes the FWD area. Then, with this second resist mask as the mask, phosphorous (P) is injected into the rear surface of the semiconductor wafer by ion implantation to form an n+ area that serves as an n+ cathode region in the FWD area on the rear surface of the semiconductor wafer. Next, the second resist mask is removed by ashing. Thereafter, the p+ and n+ areas are activated with heat treatment to form the p+ collector region on the IGBT and the n+ cathode region on the FWD.

Another well-known method (hereinafter, the second conventional method) of forming p-type and n-type areas on the rear surface of a semiconductor wafer includes forming one of the p-type and n-type areas on the entire rear surface of the semiconductor wafer by ion implantation, covering the formation area for this semiconductor region with a resist mask, and reversing the conductivity type in the formation area of another semiconductor area exposed to the openings in the resist mask by ion implantation in order to form the other semiconductor area.

Figure 8:
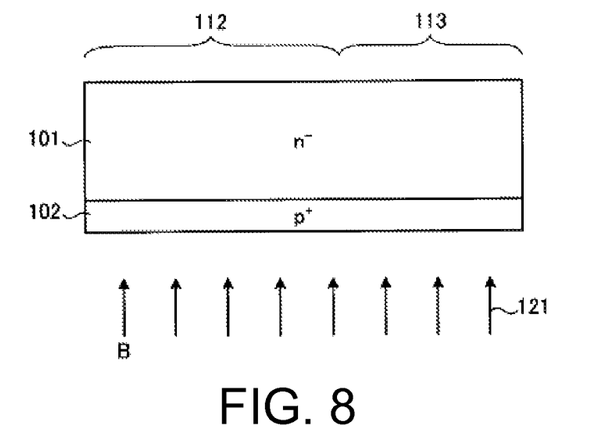
FIG. 8 is a cross-sectional view of a conventional semiconductor device during manufacturing.
Figure 9:
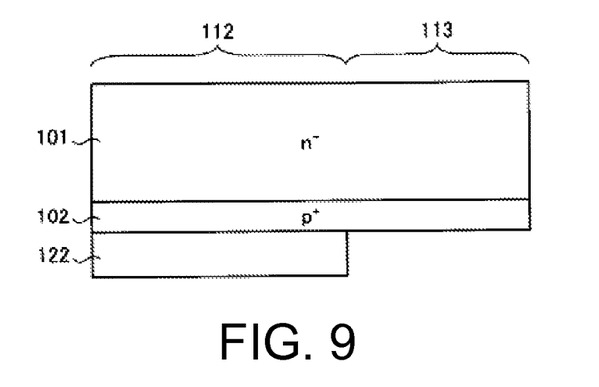
FIG. 9 is a cross-sectional view of a conventional semiconductor device during manufacturing.
Figure 10:
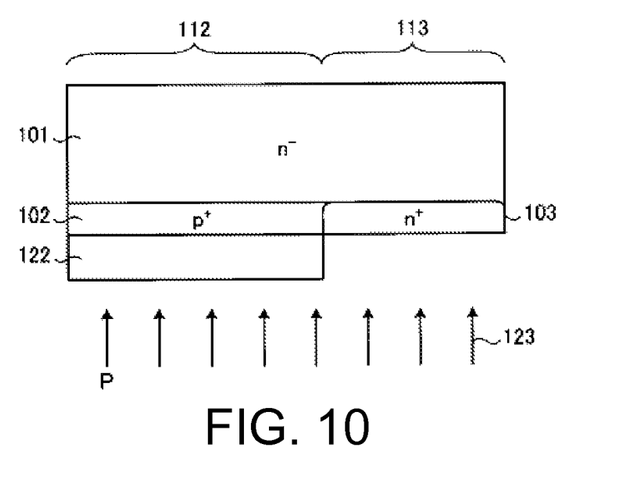
FIG. 10 is a cross-sectional view of a conventional semiconductor device during manufacturing.

FIGS. 8 to 10 are cross-sectional views of a conventional semiconductor device during manufacturing. Specifically, in the second conventional method, a first ion implantation 121 of boron is performed first to form a p+ area 102 on the entire rear surface of an n- semiconductor wafer 101 (FIG. 8). Next, a resist mask 122 that covers an IGBT area 112 and exposes an FWD area 113 is formed on the rear surface of the n- semiconductor wafer 101 (FIG. 9). Then, a second ion implantation 123 is performed to inject phosphorous into the rear surface of the n- semiconductor wafer 101 with the resist mask 122 as the mask, and this converts a portion of the p+ area 102 to an n-type.

The conversion of a portion of the p+ area 102 to the n-type forms an n+ area 103 that serves as an n+ cathode region in the FWD area 113 on the rear surface of the n- semiconductor wafer 101 and leaves the p+ area 102 that serves as a p+ collector region in the IGBT area 112 (FIG. 10). Next, the resist mask 122 is removed by ashing. Thereafter, the p+ area 102 and n+ area 103 are activated with heat treatment to form the p+ collector region of the IGBT and the n+ cathode region of the FWD.

In the first and second conventional methods described above, in general the rear surface of the semiconductor wafer is ground to make the semiconductor wafer thinner, and the above-mentioned methods are used to form the p-type and n-type areas on the thinned rear surface of the semiconductor wafer. Furthermore, the ashing treatment of the resist mask is performed with a conventional ashing device. A device having a structure that raises wafer temperature by using a wafer heating lamp and that is provided in a vacuum preparation chamber connecting a resist ashing treatment chamber to an atmospheric section is proposed as an ashing treatment device used for the ashing treatment of the resist mask, for example (see Patent Document 1 below, for example).

Forming p-type or n-type areas in recesses in the rear surface of the semiconductor wafer are well-known methods, and a method similar to this is proposed as follows. First, a resist is formed on the bottom of the semiconductor layer. At this time, the resist is patterned such that the bottom of the semiconductor layer is exposed in the area where the recesses will be formed. Next, wet etching is performed to form the recesses in the semiconductor layer where the bottom thereof is exposed. Thereafter, the resist is removed. Then, a p-type impurity is injected in the entire bottom of the semiconductor layer to form a p+ area on the entire bottom of the semiconductor layer (see Patent Document 2 (paragraphs 0021 and 0022, FIGS. 3 and 4), for example.)

Another method of forming p-type or n-type areas in recesses in the rear surface of the semiconductor wafer is proposed as follows. Recesses are formed in the bottom of a semiconductor substrate. Wet etching such as isotropic etching using a mixed liquid of hydrofluoric acid and nitric acid or crystalline anisotropic etching using an alkaline solution such as TMAH or KOH is used in the formation of the recesses. Reactive ion etching using a gas containing fluorine or dry etching such as sputter etching can also be used. After the recesses are formed, a collector layer and cathode contact layer are formed on the bottom the semiconductor substrate (see Patent Document 3 (paragraph 0022), for example).

RELATED ART DOCUMENTS

Patent Documents

Patent Document 1: Japanese Patent Application Laid-Open Publication No. 2001-244241
Patent Document 2: Japanese Patent Application Laid-Open Publication No. 2009-124049
Patent Document 3: Japanese Patent Application Laid-Open Publication No. 2010-171179

SUMMARY OF THE INVENTION

However, in the first conventional method described above, the patterning for forming the resist mask is performed twice, thus increasing manufacturing costs. Furthermore, the patterning to form the resist mask on the rear surface of the semiconductor wafer is performed after the semiconductor wafer has been made thinner. Therefore, the warping of the semiconductor wafer is larger and the alignment accuracy of the patterning is less than it would be if patterning for forming the resist mask were performed on the front surface of the semiconductor wafer. This could lead to increased variation in the widths of the openings on the resist mask and a decrease in yield.

In the second conventional method described above, the number of patterning steps for forming the resist mask can be reduced to one, but to convert the portion of the p+ area 102 to an n-type, the second ion implantation 123 of phosphorous using the resist mask 122 needs to be performed with a high dose of approximately $4 \times 10^{15}/cm^2$ to $1 \times 10^{16}/cm^2$. The higher the dose of phosphorous is during the second ion implantation 123, the longer that the second ion implantation 123 will take, thus leading to a decrease in throughput of the ion implantation process and an increase in cost.

Furthermore, the second ion implantation 123 will cause the impurity ions to collide with the resist mask 122 and the kinetic energy the resist mask 122 receives from this collision will increase the temperature of the n− semiconductor wafer 101. The longer the second ion implantation 123 is performed, the more kinetic energy that the resist mask 122 will receive due to the collision with the impurity ions, and thus the rise in temperature of the n− semiconductor wafer 101 will be greater. The heat dissipating characteristics of the semiconductor wafer also become worse the thinner the semiconductor wafer is made. Therefore, if the resist mask is used during ion implantation after the semiconductor wafer has been made thinner as described above, then it will not be possible to avoid a marked increase in temperature caused by the ion implantation as compared to if the same process were being performed with a normal non-thinned semiconductor wafer.

Thus, the increase in temperature of the semiconductor wafer during ion implantation will cause the organic solvent components constituting the resist mask to become volatile, thereby generating gas (so-called degassing) in the chamber of the ion implantation device and leading to a reduced vacuum level inside the chamber. This could cause the ion beams to scatter and make it impossible to perform ion implantation at the preconfigured doses, resulting in substantial variation in dose amounts. The reduced vacuum level in the ion implantation device chamber could be regarded as an abnormality that requires the intervention of a technician or other maintenance, for example, and in such a case, the ion implantation must be aborted.

An increase in the temperature of the semiconductor wafer during ion implantation could also cause the organic solvent components constituting the resist mask to suddenly boil, effuse, and scatter (foaming of the resist mask), thereby causing foreign matter such as particles to attach to the semiconductor wafer. Furthermore, there is a risk that the front surface layer of the resist mask will reach high temperatures and form an altered layer caused by hardening, and that resist residue will form due to not being able to completely remove the resist mask during the ashing treatment. Therefore, there is a risk that yield could decrease. If the subsequent processes are continued after the resist residue has formed, then this resist residue will cause the semiconductor wafer to be contaminated in these subsequent processes and a so-called cross contamination in which the processing devices and consequently other semiconductor wafers become contaminated is also possible; therefore, there is a risk that yield could be reduced even further.

In order to solve the problems with the conventional technologies described above, the present invention aims at providing a method of manufacturing a semiconductor device that can reduce manufacturing costs. In order to solve the problems with the conventional technologies described above, the present invention also aims at providing a method of manufacturing a semiconductor device that can improve yield.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method of manufacturing a semiconductor device that includes the following features. First, a first ion implantation step of implanting a p-type impurity into a surface of a semiconductor wafer to form a p-type impurity region in a surface layer of the semiconductor wafer is performed. Next, a coating step of coating a resist on the surface of the semiconductor wafer where the p-type impurity region is formed is performed. Next, an exposing step of patterning the resist to selectively expose the semiconductor wafer is performed. Next, a second ion implantation step of implanting an n-type impurity into the semiconductor wafer using the resist that remains as a mask is performed to selectively form an n-type impurity region, this n-type impurity region being deeper than the p-type impurity region from the surface of the semiconductor wafer and being adjacent to the p-type impurity region. Next, a removal step of removing a portion of the semiconductor wafer above the n-type impurity region to expose the n-type impurity region is performed, the removed portion of the semiconductor wafer being a region where the p-type impurity has been implanted in the first ion implantation step.

In the removal step, the portion of the semiconductor wafer may be removed such that a peak location of an impurity concentration distribution of the n-type impurity region is near a surface where the n-type impurity region is being exposed.

In the second ion implantation step, the n-type impurity may be implanted such that a peak location of an n-type impurity concentration distribution is near a surface that will be exposed in the removal step.

In the removal step, the resist that remains and the portion of the semiconductor wafer above the n-type impurity region may be removed at the same time.

In the removal step, ashing may be performed on the resist and etching may be performed on the portion of the semiconductor wafer above the n-type impurity region in an oxygen gas atmosphere that includes fluorine.

In the first ion implantation step, the p-type impurity may be implanted at a first acceleration energy, and in the second ion implantation step, the n-type impurity may be implanted at a second acceleration energy that is greater than the first acceleration energy.

In the second ion implantation step, a dose of the n-type impurity may be less than or equal to $1.0 \times 10^{15}/cm^2$.

According to this aspect of the invention described above, when forming a p+ area and n+ area on the same main surface of a semiconductor wafer, the number of patterning steps performed for forming the resist mask can be reduced to one. Furthermore, according to one aspect the invention described above, when forming the p+ area and n+ area on the same main surface of the semiconductor wafer, it is possible to form the n+ area having a small contact resistance with the rear surface electrode even though the n-type impurity is not injected during ion implantation at a high enough dose to convert the p+ area to an n-type, as in the second conventional method. According to this aspect of invention described above, the dose during the ion implantation performed using the resist mask can be reduced; thus, the processing time of ion implantation can be shortened and throughput can be improved.

According to this aspect of the invention described above, the dose during the ion implantation performed using the resist mask can be reduced; therefore, the kinetic energy received by the resist mask during ion implantation can be reduced and an increase in temperature of the semiconductor wafer can be suppressed even if ion implantation is performed on a thinned semiconductor wafer. This makes it possible to suppress variation in dose during ion implantation, degassing, and foaming and altering of the resist. Suppressing foaming and altering of the resist reduces resist residue, and thus, it is possible to suppress the semiconductor wafer becoming contaminated and the processing devices becoming contaminated and then contaminating other semiconductor wafers A method of manufacturing a semiconductor device according to the present invention has the effect of making it possible to reduce manufacturing costs. A method of manufacturing a semiconductor device according to the present invention also has the effect of making it possible to improve yield.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Preferred embodiments of a method of manufacturing a semiconductor device according to the present invention will be described in detail below with reference to the attached drawings. In the present specification and amended drawings, electrons or holes in layers or areas marked with an "n" or "p" signify majority carriers. The "+" or "−" attached to the "n" or "p" respectively signify higher impurity concentrations and lower impurity concentrations than layers or areas without these marks. In the explanation of the embodiments below and the attached drawings, the same reference characteristics are attached to similar configurations and repetitive descriptions will be omitted.

Embodiment 1

Figure 1:
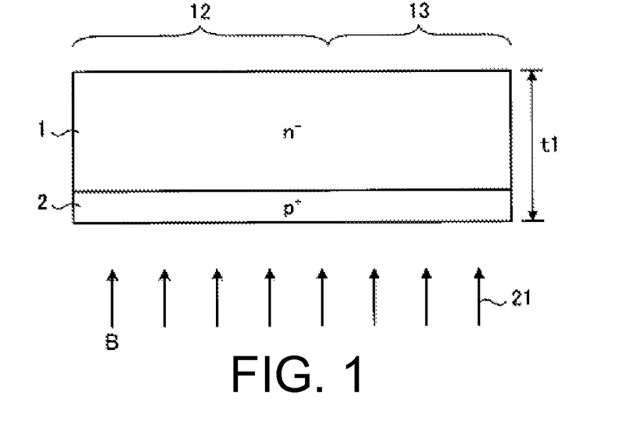
FIG. 1 is a cross-sectional view of a semiconductor device of Embodiment 1 during manufacturing.
Figure 2:
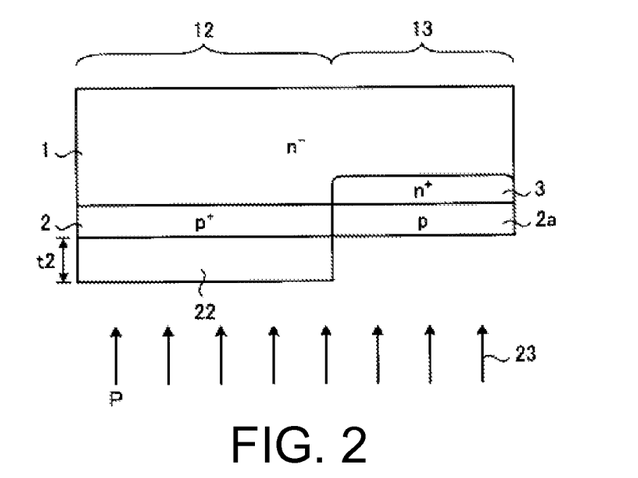
FIG. 2 is a cross-sectional view of the semiconductor device of Embodiment 1 during manufacturing.
Figure 3:
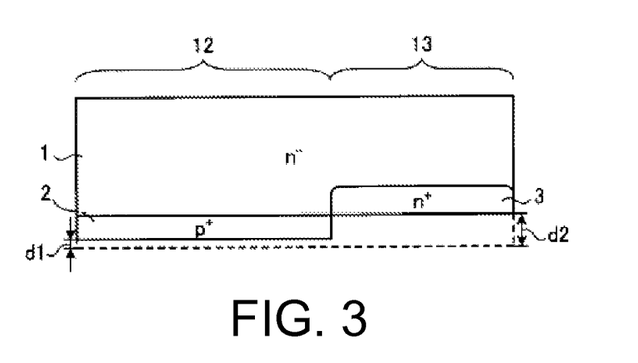
FIG. 3 is a cross-sectional view of the semiconductor device of Embodiment 1 during manufacturing.

A method of manufacturing a semiconductor device according to Embodiment 1 will be explained. FIGS. 1 to 3 are cross-sectional views of a semiconductor device of Embodiment 1 during the manufacturing thereof. In FIGS. 1 to 3, the front surface of an n− semiconductor wafer 1 is the top, but the primary surface of the n− semiconductor wafer 1 is flipped as appropriate in the respective steps. Furthermore, in FIGS. 1 to 3, the structure of the front surface side of the n− semiconductor wafer 1 is omitted. An example will be explained in which an RC-IGBT having an IGBT and FWD embedded in the same semiconductor chip is manufactured. In other words, an RC-IGBT is made having a p+ collector region provided on an IGBT area 12 and an n+ cathode region provided on an FWD area 13 on the rear surface of a semiconductor chip formed of the n− semiconductor wafer 1.

First, as shown in FIG. 1, a front surface element structure (not shown) of an IGBT and FWD is formed by a conventional method on the front surface of the n− semiconductor wafer 1. Next, the rear surface of the n− semiconductor wafer 1 is ground such that a thickness t1 of the n− semiconductor wafer 1 is reduced to 100 µm, for example. Next, a p-type impurity such as boron (B) is injected by a first ion implantation 21 into the entire rear surface of the thinned n− semiconductor wafer 1, and this forms a p+ area 2 on the rear surface layer of the n− semiconductor wafer 1 from the IGBT area 12 to the FWD area 13.

The p+ area 2 in the IGBT area 12 is made thinner through ashing and etching as described later. Therefore, the acceleration energy of the first ion implantation 21 (an average penetration depth Rp1 of the p-type impurity implanted by the first ion implantation 21), is set such that, in consideration of the p+ area 2 being made thinner in the ashing and etching process as described later, the p+ area 2 is formed at a thickness equal to the sum of a depth (hereinafter, the etching depth of the p+ area 2) d1 of the etching of the p+ area 2 and the thickness of the p+ area 2 after completion of the RC-IGBT. The average penetration depth is the depth from the rear surface of the n− semiconductor wafer 1 to the peak concentration location of the impurity concentration distribution represented by the Gaussian distribution in the n− semiconductor wafer 1.

Specifically, the acceleration energy of the first ion implantation 21 is set such that the average penetration depth Rp1 of the p-type impurity implanted by the first ion implantation 21 is less than or equal to 0.05 µm, for example. More specifically, the acceleration energy of the first ion implantation 21 may be less than or equal to 50 keV, for example. The dose of the p-type impurity in the first ion implantation 21 may be approximately $1\times10^{13}/cm^2$ to $1\times10^{14}/cm^2$, for example. The peak concentration of the p+ area 2 may be approximately $0\times10^{16}/cm^3$ to $1.0\times10^{17}/cm^3$, for example.

Next, as shown in FIG. 2, resist is coated on the rear surface of the n− semiconductor wafer 1. Next, the resist is patterned to form a resist mask 22 that covers the IGBT area 12 and exposes the FWD area 13. A thickness t2 of the resist mask 22 will be described later. Next, using this resist mask 22 as the mask, an n-type impurity such as phosphorous (P) is injected into the rear surface of the n– semiconductor wafer 1 through a second ion implantation 23, and this forms an n+ area 3, which serves as an n+ cathode area, on a portion deeper than the p+ area 2 from the rear surface of the n– semiconductor wafer 1.

The acceleration energy of the second ion implantation 23 is higher than the acceleration energy of the first ion implantation 21. In other words, an average penetration depth Rp2 of the n-type impurity injected by the second ion implantation 23 is deeper than the average penetration depth Rp1 of the p-type impurity injected by the first ion implantation 21. Specifically, the acceleration energy of the second ion implantation 23 is set such that the average penetration depth Rp2 of the n-type impurity implanted by the second ion implantation 23 is at least 3 μm, for example. More specifically, the acceleration energy of the second ion implantation 23 may be approximately 300 keV to 500 keV, for example. The acceleration energy of the second ion implantation 23 can be set such that the n+ area 3 is deeper than the p+ area 2 from the rear surface of the n– semiconductor wafer 1 and is in contact with the p+ area 2, for example, thereby making it possible to shorten the ashing and etching processes as described later and improve throughput.

This second ion implantation 23 causes the p+ area 2 between the rear surface of the n– semiconductor wafer 1 and the n+ area 3 to become a p-type area 2a with a lower impurity concentration than the p+ area 2. In other words, the dose of the n-type impurity during the second ion implantation 23 may be low enough that the p+ area 2 is not changed to n-type. Specifically, the dose of n-type impurity during the second ion implantation 23 may be $1\times10^{14}/cm^2$ to $3\times10^{15}/cm^2$, for example. The dose of n-type impurity during the second ion implantation 23 may preferably be $3\times10^{14}/cm2$ to $1\times10^{15}/cm^2$, for example. The second ion implantation 23 is performed such that the peak concentration of the n+ area 3 is higher than the peak concentration of the p+ area 2. This is because the impurity concentration of the n+ area 3 on the vicinity of the boundary with the p-type area 2a can be made higher, and the contact resistance between the n+ cathode region and the rear surface electrode can be made smaller. The peak concentration of the n+ area 3 may be approximately $1.0\times10^{19}/cm^3$ ($3.0\times10^{18}/cm^3$ to $1.0\times10^{20}/cm^3$), for example.

Next, as shown in FIG. 3, the n– semiconductor wafer 1 is exposed to an oxygen ($O_2$) atmosphere with fluorine (F) gas added and the resist mask 22 is ashed using oxygen gas (oxygen plasma). The silicon portion (surface layer of the p+ area 2 on the IGBT area 12) in contact with the resist mask 22 is also etched by the fluorine gas, thereby removing the resist mask 22 for each silicon part. At this time, the silicon portion between the rear surface of the n– semiconductor wafer 1 in the FWD area 13 and the n+ area 3 not covered by the resist mask 22 is removed along with the resist mask 22 (hereinafter, the ashing and etching process). The silicon portion between the rear surface of the n– semiconductor wafer 1 in the FWD area 13 and the n+ area 3 includes at least the p-type area 2a.

In the ashing and etching process described above, the resist mask 22 is completely removed to expose the p+ area 2 of the IGBT area 12; therefore, the p+ area 2 of the IGBT area 12 is etched according to the processing time of the ashing and etching process. Accordingly, the introduction dose of fluorine gas added to the oxygen gas atmosphere or the like may be adjusted, for example, such that an etching depth d1 of the p+ area 2 in the IGBT area 12 is within a prescribed range.

The fluorine gas added to the oxygen gas atmosphere may be a gas containing carbon fluoride ($CF_4$) or sulfur fluoride ($SF_6$), for example. Instead of fluorine gas, the gas added to the oxygen gas atmosphere may also be another gas containing an element or compound having a silicon etching effect.

A depth (hereinafter, the etching depth of the n– semiconductor wafer 1 rear surface) d2 at which the n– semiconductor wafer 1 rear surface is etched in the FWD area 13 is calculated on the basis of the average penetration depth Rp1 and the dose of the p-type impurity during the first ion implantation 21 and the average penetration depth Rp2 and the dose of the n-type impurity during the second ion implantation 23. The ashing rate and etching rate during the ashing and etching process is calculated on the basis of the thickness t2 of the resist mask 22 and the etching depth d2 of the n– semiconductor wafer 1 rear surface in the FWD 13 area. The calculating scheme of the etching depth d2 of the n– semiconductor wafer 1 rear surface in the FWD area 13, the ashing rate, and the etching rate will be described later. By performing the ashing and etching process in this manner, the p+ area 2 is exposed in the IGBT area 12 and the n+ area 3 is exposed in the FWD area 13 on the rear surface of the n– semiconductor wafer 1. In FIG. 3, the portion of the rear surface side of the n– semiconductor wafer 1 removed by etching is shown with a broken line.

The removal of the p-type area 2a causes a level difference on the rear surface of the n– semiconductor wafer 1 between the IGBT area 12 and FWD area 13, but this does not lower the mechanical strength of the semiconductor device. The reason for this is as follows. The depth of the level difference on the rear surface of the n– semiconductor wafer 1, or namely the etching depth d2 of the n– semiconductor wafer 1 rear surface in the FWD area 13 is approximately 0.1 μm, for example. This level difference on the rear surface of this n– semiconductor wafer 1 is covered by a rear surface electrode with a thickness of approximately 1 μm, which is thicker than the depth of the level difference on the rear surface of the n– semiconductor wafer 1, and/or covered by a soldering layer for wiring line connections. Accordingly, the stress exerted on the rear surface of the n– semiconductor wafer 1 is absorbed by the rear surface electrode and/or soldering layer; therefore, the level difference that has a depth that is approximately the etching depth d2 of the n– semiconductor wafer 1 rear surface does not degrade the mechanical strength of the semiconductor device.

Next, heat treatment is used to activate the p+ area 2 and n+ area 3. This forms the p+ collector region, which is made by activation of the p+ area 2, in the IGBT area 12, and the n+ cathode region, which is made by activation of the n+ area 3, in the FWD area 13. Thereafter, a rear surface electrode in contact with the p+ collector region and n+ cathode region is formed on the rear surface of the n– semiconductor wafer 1, thereby completing the RC-IGBT.

Figure 4:
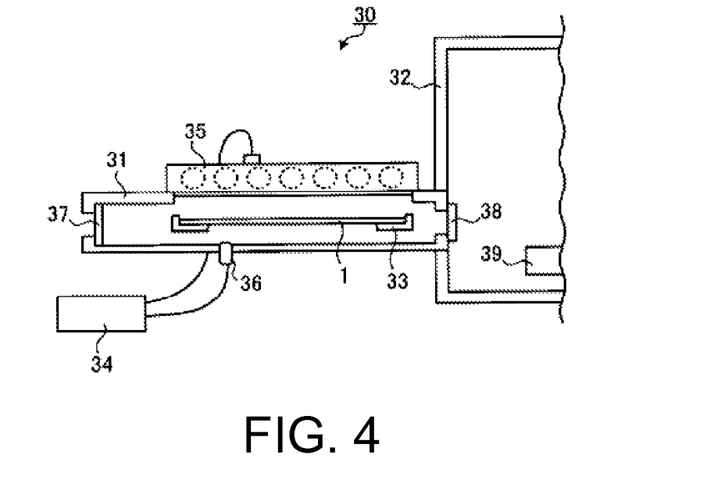
FIG. 4 is a schematic cross-sectional view of a semiconductor manufacturing device of Embodiment 1.

Next, an example of the ashing device used in the ashing and etching process will be described. FIG. 4 is a schematic cross-sectional view of a semiconductor manufacturing device of Embodiment 1. The semiconductor manufacturing device of Embodiment 1 shown in FIG. 4 is a single wafer dry ashing device 30. The dry ashing device 30 includes a vacuum preparation chamber 31, treatment chamber 32, transport arm 33, and control unit 34. The vacuum preparation chamber 31 includes a depressurizing structure (not shown) that maintains the vacuum atmosphere therein, a heating lamp 35 that heats the n– semiconductor wafer 1 carried to inside the vacuum preparation chamber 31, and a temperature sensor 36 that measures the temperature inside the vacuum preparation chamber 31.

The vacuum preparation chamber 31 also has first and second gate valves 37 and 38, which can be opened or closed, for carrying the n− semiconductor wafer 1 in and out. The vacuum preparation chamber 31 is connected to the atmospheric side (outside the dry ashing device 30) through the first gate valve 37. The n− semiconductor wafer 1 transported from the atmospheric side by the transport arm 33 is carried into the vacuum preparation chamber 31 through the first gate valve 37. The n− semiconductor wafer 1 carried into the vacuum preparation chamber 31 is heated to a prescribed temperature by the heating lamp 35 before being transported to the treatment chamber 32. The treatment chamber 32 is connected to the vacuum preparation chamber 31 through the second gate valve 38.

The n− semiconductor wafer 1 transported from the vacuum preparation chamber 31 by the transport arm 33 is carried into the treatment chamber 32 through the second gate valve 38. The n− semiconductor wafer 1 carried into the treatment chamber 32 is placed on a stage 39 by the transport arm 33. Oxygen gas and fluorine gas are introduced into the treatment chamber 32 from a gas feed port (not shown), for example, and this forms an oxygen gas atmosphere with fluorine gas added. Ashing treatment of the resist mask 22 on the n− semiconductor wafer 1 rear surface and etching treatment of the rear surface layer of the n− semiconductor wafer 1 in the FWD area 13 are performed simultaneously in this treatment chamber 32 (the ashing and etching process). The control unit 34 controls the respective constituting components of the dry ashing device 30.

Figure 5:
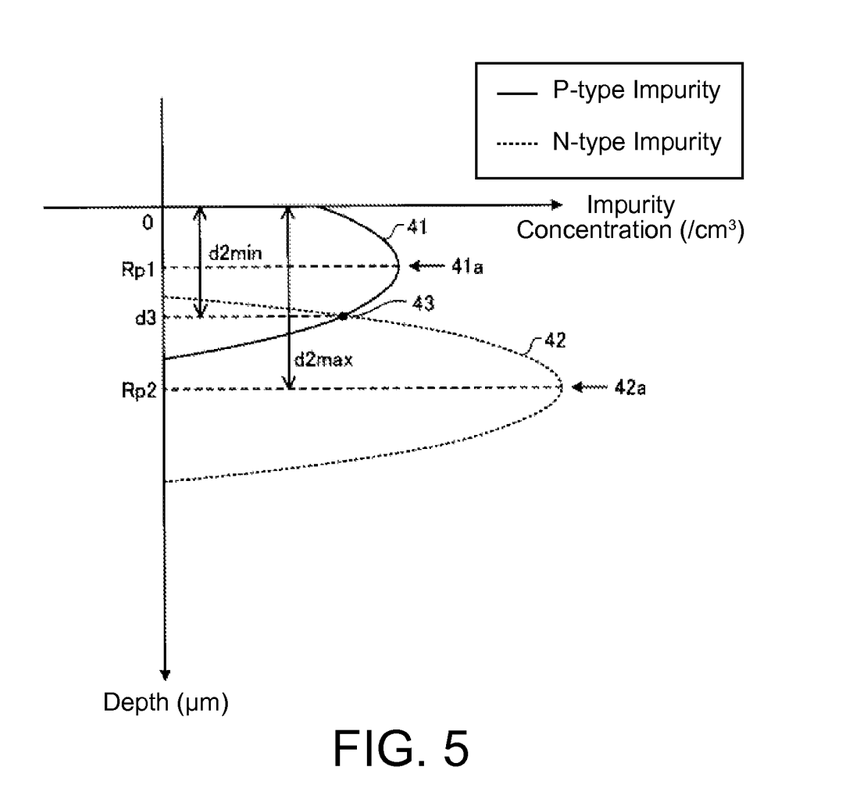
FIG. 5 is a characteristic view of the impurity concentration distribution on the rear surface of the semiconductor device of Embodiment 1.

Next, the scheme of calculating the etching depth d2 of the n− semiconductor wafer 1 rear surface in the FWD area 13 will be described. FIG. 5 is a characteristic view of the distribution of impurity concentration on the rear surface of the semiconductor device of Embodiment 1. FIG. 5 shows a p-type impurity concentration distribution 41 and an n-type impurity concentration distribution 42 in the portions on the rear surface of the n− semiconductor wafer 1 in the FWD area 13 where the p+ area 2 and n+ area 3 are formed. The n− drift region and impurity concentration of the front surface element structure are not shown. The vertical axis in FIG. 5 is the depth from the rear surface of the n− semiconductor wafer 1, and depth=0 μm is the rear surface location of the n− semiconductor wafer 1 before the ashing and etching process.

As shown in FIG. 5, by forming the p+ area 2 and n+ area 3 according to the method of manufacturing a semiconductor device as described above, a peak location 42a of the n-type impurity concentration distribution 42 in the FWD area 13 is at a deeper location from the rear surface of the n− semiconductor wafer 1 than a peak location 41a of the p-type impurity concentration distribution 41. To lower the contact resistance between the n+ cathode region and the rear surface electrode, the surface concentration of the n+ cathode region can be increased. Therefore, it is preferable that the etching depth d2 of the n− semiconductor wafer 1 rear surface in the FWD area 13 be set such that the peak location 42a of the n-type impurity concentration distribution 42 is closer to the rear surface of the n− semiconductor wafer 1.

In other words, the etching depth d2 of the n− semiconductor wafer 1 rear surface in the FWD area 13 may be less than or equal to the depth of the average penetration depth Rp2 of the n-type impurity during the second ion implantation 23 (d2≤Rp2). Namely, it is preferable that the etching depth d2 of the n− semiconductor wafer 1 rear surface in the FWD area 13 be the same as the average penetration depth Rp2 of the n-type impurity during the second ion implantation 23. Thus, it is preferable that the etching depth d2 of the n− semiconductor wafer 1 rear surface in the FWD area 13 be the same depth as the average penetration depth Rp2 of the n-type impurity during the second ion implantation 23, taking into account an etching unevenness in the order of the standard deviation of ΔRp2 (=Rp2×10%) of the average penetration depth Rp2 of the n-type impurity during the second ion implantation 23; (d2+ΔRp2=Rp2).

Furthermore, an area with a low n-type impurity concentration or the p-type area 2a is formed on the portion from the rear surface of the n− semiconductor wafer 1 before ashing and etching to a depth where the p-type impurity concentration and n-type impurity concentration become equivalent (a depth d3 of an intersection point 43 between the p-type impurity concentration distribution 41 and n-type impurity concentration distribution 42). Accordingly, it is preferable that the rear surface layer of the n− semiconductor wafer 1 be removed to the depth d3 at at least the intersection 43 between the p-type impurity concentration distribution 41 and the n-type impurity concentration distribution 42 in the FWD area 13 in order to increase the n-type impurity concentration near the rear surface of the n− semiconductor wafer 1 after ashing and etching (d2≥d3). FIG. 5 shows a maximum etching depth d2max (=Rp2) and a minimum etching depth d2min (=d3) of the n− semiconductor wafer 1 rear surface in the FWD area 13.

It is preferable that the depth d3 of the intersection point 43 between the p-type impurity concentration distribution 41 and the n-type impurity concentration distribution 42 be at least two times the standard deviation ΔRp1 of the average penetration depth Rp1 during first ion implantation 21 from the average penetration depth Rp1 during the first ion implantation 21 (d3≥Rp1+2·ΔRp1). This is because the region up to a depth from the n− semiconductor wafer 1 rear surface in the FWD area 13 equal to the sum of the average penetration depth Rp1 during the first ion implantation 21 and twice the standard deviation ΔRp1 thereof (Rp1+2·ΔRp1) serves as a portion of the n− semiconductor wafer 1 rear surface with a high p-type impurity concentration. To set the depth d3 at an appropriate depth, the p-type impurity concentration distribution 41 and n-type impurity concentration distribution 42 on the rear surface side of the n− semiconductor wafer 1 can be adjusted on the basis of the average penetration depth Rp1 and dose of the p-type impurity during the first ion implantation 21 and the average penetration depth Rp2 and dose of the n-type impurity during the second ion implantation 23.

Figure 6:
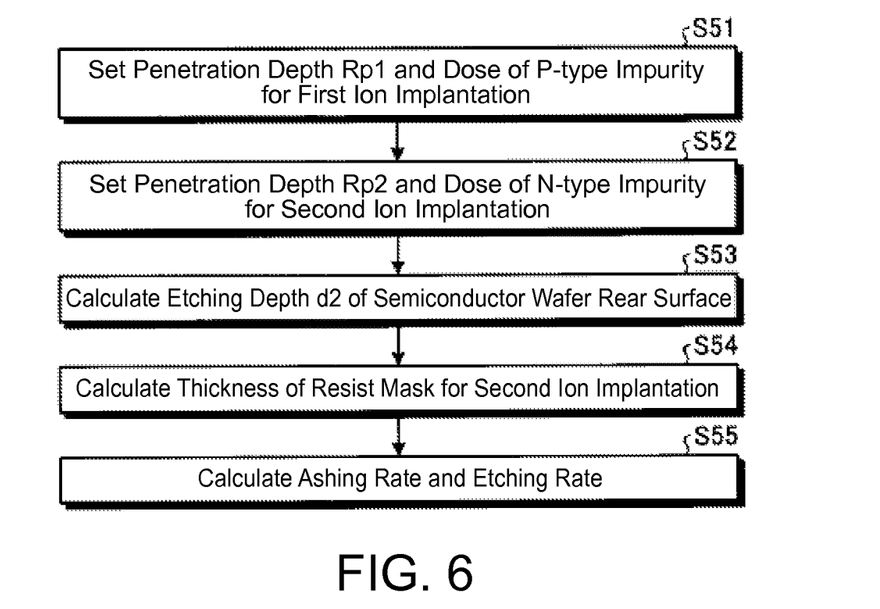
FIG. 6 is a flowchart of an overview of a method of manufacturing a semiconductor device of Embodiment 1.

Next, the scheme of calculating the rate of ashing the resist mask 22 during the ashing and etching process will be described. FIG. 6 is a flowchart of an overview of a method of manufacturing a semiconductor device of Embodiment 1. As shown in FIG. 6, first the average penetration depth Rp1 and the dose of the p-type impurity during first ion implantation 21 (acceleration energy) are set (step S51). Next, the average penetration depth Rp2 and the dose of the n-type impurity during the second ion implantation 23 (acceleration energy) are set on the basis of the setting value in step S51 (step S52). Next, the etching depth d2 of the n− semiconductor wafer 1 rear surface in the FWD area 13 is calculated as described above on the basis of the setting values in step S51 and step S52 (step S53).

Next, the thickness t2 of the resist mask 22 used for the second ion implantation 23 is calculated on the basis of the setting values in step S52 (step S54). The thickness t2 of the resist mask 22 is at least thick enough (approximately 3 μm, for example) that the n-type impurity will not be injected into the IGBT area 12 during the second ion implantation 23. Next, the ashing rate and etching rate of the ashing and etching process are calculated on the basis of the calculated values in steps S53 and S54 (step S55). The ashing rate and etching rate are set such that the ashing process of the resist mask 22 and the etching process of the rear surface layer with a prescribed thickness of the n– semiconductor wafer 1 finish at approximately the same time. This ends the process in the flowchart.

As described above, in Embodiment 1, the p+ area is formed on the entire rear surface of the semiconductor wafer and the resist mask is used during the second ion implantation of the n-type impurity to selectively form the n+ area on a portion deeper from the rear surface of the semiconductor wafer than the p+ area, thereby making it possible to reduce the number of patterning steps for forming the resist mask to one and allowing the p+ area and n+ area to be accurately formed on the same main surface of the semiconductor wafer. Furthermore, according to Embodiment 1, manufacturing costs can be reduced because the number of patterning steps for forming the resist mask can be reduced to one.

According to Embodiment 1, the silicon portion between the rear surface of the semiconductor wafer and the n+ area can be removed after the resist mask is used to inject the n-type impurity during the second ion implantation and selectively form the n+ area on a portion deeper from the rear surface of the semiconductor wafer than the p+ area. This makes it possible to form the n+ area having a small contact resistance with the rear surface electrode even though the n-type impurity is not injected during ion implantation at a high dose sufficient to convert the p+ area to an n-type, as in the second conventional method.

According to Embodiment 1, the dose during the second ion implantation performed using the resist mask can be reduced; thus, the processing time of the second ion implantation can be shortened and the throughput can be improved. Specifically, in the second conventional method, the dose of n-type impurity during the ion implantation for forming the n+ area is approximately $3\times10^{15}/cm^2$ to $4\times10^{15}/cm^2$; therefore, the ion implantation requires approximately 30 to 40 minutes. In contrast, according to Embodiment 1, the dose of the n-type impurity during the second ion implantation can be reduced to $1\times10^{15}/cm^2$ or below; thus, the second ion implantation can be shortened by approximately 10 minutes. This allows for a reduction in manufacturing costs.

According to Embodiment 1, the dose during the second ion implantation performed using the resist mask can be reduced; therefore, the kinetic energy received by the resist mask during ion implantation can be reduced and an increase in temperature of the semiconductor wafer can be suppressed even though ion implantation is performed on a thinned semiconductor wafer. This makes it possible to suppress variation in dose during ion implantation, degassing, and foaming and altering of the resist. Suppressing foaming and altering of the resist reduces resist residue, and thus, it is possible to suppress the semiconductor wafer becoming contaminated and the processing devices becoming contaminated and then contaminating other semiconductor wafers. Accordingly, yield can be improved.

According to Embodiment 1, the ashing process of the resist mask and the etching process of the silicon part between the rear surface of the semiconductor wafer and the n+ area can be performed in one step by exposing the semiconductor substrate to the oxygen gas atmosphere with fluorine added to remove the resist mask used in the formation of the n+ area and removing the silicon part between the rear surface of the semiconductor wafer and the n+ area. This can improve throughput.

Embodiment 2

Figure 7:
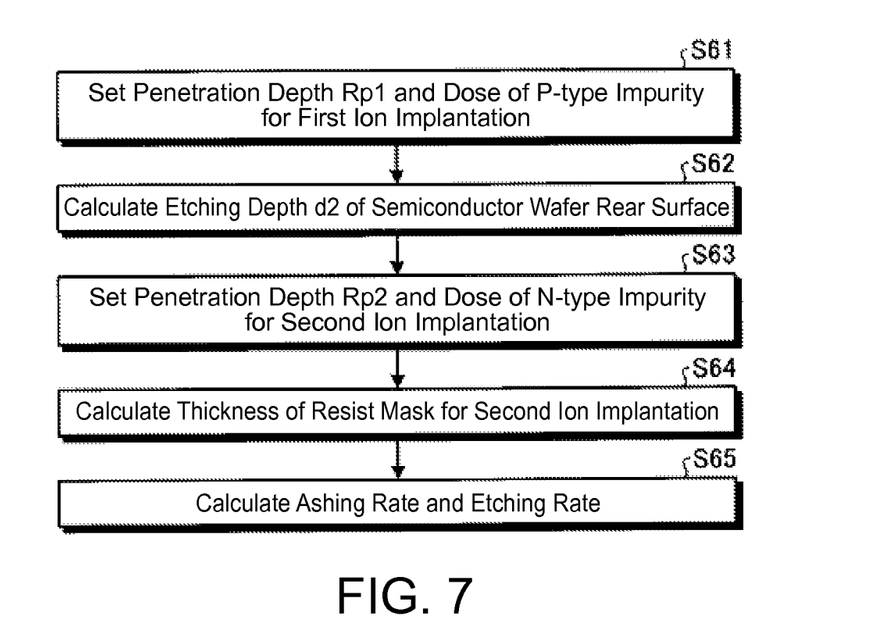
FIG. 7 is a flowchart of an overview of a method of manufacturing a semiconductor device of Embodiment 2.

Next, a method of manufacturing a semiconductor device according to Embodiment 2 will be described. FIG. 7 is a flowchart of an overview of the method of manufacturing a semiconductor device of Embodiment 2. The method of manufacturing a semiconductor device of Embodiment 2 differs from the method of manufacturing a semiconductor device in Embodiment 1 in the calculating scheme of the ashing rate and etching rate of the ashing and etching process.

As shown in FIG. 7, first an average penetration depth Rp1 and the dose of the p-type impurity during first ion implantation 21 (acceleration energy) are set (step S61). Next, an etching depth d2 of an n⁻ semiconductor wafer 1 rear surface in an FWD area 13 is calculated as described above on the basis of the setting values in step S61 (step S62). Next, an average penetration depth Rp2 and the dose of the n-type impurity during second ion implantation 23 (acceleration energy) are set on the basis of the setting values in step S62 (step S63).

In step S63, the implantation conditions for the second ion implantation 23 are calculated such that a peak location 42a of an n-type impurity concentration distribution 42 during the second ion implantation 23 is located near the rear surface of the n– semiconductor wafer 1 after etching. Specifically, using the calculating scheme of the etching depth d2 of the n– semiconductor wafer 1 rear surface in the FWD area 13 in Embodiment 1, the average penetration depth Rp1 and the dose of the p-type impurity during the first ion implantation 21 and the etching depth d2 of the n– semiconductor wafer 1 rear surface in the FWD area 13 are treated as known, and at this time the average penetration depth Rp2 and the dose of n-type impurity during the second ion implantation 23 are calculated.

Next, the thickness t2 of the resist mask 22 used for the second ion implantation 23 is calculated on the basis of the calculated values in step S63, in a manner similar to Embodiment 1 (step S64). Next, the ashing rate and etching rate of the ashing and etching process are calculated on the basis of the calculated values in steps S63 and S64 (step S65), and this ends the process in the flowchart.

As described above, Embodiment 2 can obtain similar effects to Embodiment 1.

Embodiment 3

Next, a method of manufacturing a semiconductor device according to Embodiment 3 will be described. The method of manufacturing a semiconductor device of Embodiment 3 differs from the method of manufacturing a semiconductor device of Embodiment 1 in that the ashing and edging process is divided into two steps: performing ashing on a resist mask 22, and performing etching on a silicon part between a rear surface of a n– semiconductor wafer 1 in an FWD area 13 and an n+ area 3.

Specifically, in a manner similar to Embodiment 1, first the steps from the formation of the front surface element structure to a second ion implantation 23 are performed. Next, the resist mask 22 is removed using a conventional method, such as by performing ashing in an oxygen gas (oxygen plasma) atmosphere, for example. The oxygen atmosphere may have fluorine gas added thereto, in a manner similar to Embodiment 1. Next, the silicon part between the rear surface of the n– semiconductor wafer 1 in the FWD area 13 and the n+ area 3 is removed by a conventional method, such as performing etching similar to trench etching, for example. The order of the ashing process and etching process may be switched. Thereafter, the steps after activating a p+ area 2 and n+ area 3 are performed in a manner similar to Embodiment 1, thereby completing an RC-IGBT having a conventional configuration.

As described above, Embodiment 3 can obtain similar effects to Embodiments 1 and 2.

In the present invention as described above, an example was described in which the p-type and n-type areas are formed on the rear surface of the semiconductor wafer, but without being limited to the respective embodiments above, the p-type and n-type areas can also be applied to the front surface of the semiconductor wafer. In the respective embodiments described above, various modifications can be performed in accordance with the desired specifications or the like, such as the dimensions of the respective components, the surface concentration, and the like, for example.

INDUSTRIAL APPLICABILITY

As described above, a method of manufacturing a semiconductor device according to the present invention is useful for a power semiconductor device such as an RC-IGBT, for example, which is provided with both p-type and n-type areas on one main surface of a semiconductor wafer.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing a semiconductor device, comprising:
    a first ion implantation step of implanting a p-type impurity into a surface of a semiconductor wafer to form a p-type impurity region in a surface layer of said semiconductor wafer;
    a coating step of coating a resist on the surface of the semiconductor wafer where the p-type impurity region is formed;
    an exposing step of patterning the resist to selectively expose the semiconductor wafer;
    a second ion implantation step of implanting an n-type impurity into the semiconductor wafer using the resist that remains as a mask to selectively form an n-type impurity region, said n-type impurity region being deeper than the p-type impurity region from the surface of the semiconductor wafer and being adjacent to the p-type impurity region; and
    a removal step of removing a portion of the semiconductor wafer above the n-type impurity region to expose the n-type impurity region, the removed portion of the semiconductor wafer being a region where the p-type impurity has been implanted in the first ion implantation step.

2. The method of manufacturing a semiconductor device according to claim 1,
    wherein, in the removal step, the portion of the semiconductor wafer is removed such that a peak location of an impurity concentration distribution of the n-type impurity region is near a surface where the n-type impurity region has been exposed.

3. The method of manufacturing a semiconductor device according to claim 1,
    wherein, in the second ion implantation step, the n-type impurity is implanted such that a peak location of an n-type impurity concentration distribution is near a surface that will be exposed in the removal step.

4. A method of manufacturing a semiconductor device according to claim 1,
    wherein, in the removal step, the resist that remains and the portion of the semiconductor wafer above the n-type impurity region is removed at the same time.

5. The method of manufacturing a semiconductor device according to claim 4,
    wherein, in the removal step, ashing is performed on the resist and etching is performed on the portion of the semiconductor wafer above the n-type impurity region in an oxygen gas atmosphere that includes fluorine.

6. The method of manufacturing a semiconductor device according to claim 1,
    wherein, in the first ion implantation step, the p-type impurity is implanted at a first acceleration energy, and
    wherein, in the second ion implantation step, the n-type impurity is implanted at a second acceleration energy that is greater than the first acceleration energy.

7. The method of manufacturing a semiconductor device according to claim 1, wherein, in the second ion implantation step, a dose of the n-type impurity is less than or equal to $1.0 \times 10^{15}/cm^2$.

* * * * *